(12) United States Patent  
Willie et al.

(10) Patent No.: US 9,184,313 B1
(45) Date of Patent: Nov. 10, 2015

(54) PV MODULE CELL MATRIX PLACEMENT STATION AND METHODS FOR REMOVING AIR OR BUBBLES DURING THE MANUFACTURING PROCESS

(71) Applicant: Flextronics AP, LLC, Broomfield, CO (US)

(72) Inventors: Dennis Willie, San Jose, CA (US); Chris Stratas, Burlingame, CA (US); Tilak Gopalarathnam, San Jose, CA (US); Susan Ciby Abraham, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/509,956

(22) Filed: Oct. 8, 2014

Related U.S. Application Data

(60) Provisional application No. 61/888,447, filed on Oct. 8, 2013.

(51) Int. Cl.
*H01L 21/02* (2006.01)
*H01L 31/0203* (2014.01)
*H01L 31/18* (2006.01)

(52) U.S. Cl.
CPC ............ *H01L 31/0203* (2013.01); *H01L 31/18* (2013.01)

(58) Field of Classification Search
None
See application file for complete search history.

(56) References Cited

U.S. PATENT DOCUMENTS

2014/0017845 A1* 1/2014 Juen et al. .................... 438/66
2014/0183766 A1* 7/2014 Powers et al. ............... 264/1.36

OTHER PUBLICATIONS

Komp et al., Simplified method of Encapsulating Fragile PV Cells for Cottage Industry Production of Photovoltaic Modules, 39th ASES National Solar Conference 2010, Solar 2010 1: pp. 184-217, American Solar energy Society. (Dec. 1, 2010).*

* cited by examiner

*Primary Examiner* — Asok K Sarkar
(74) *Attorney, Agent, or Firm* — Haverstock & Owens LLP

(57) ABSTRACT

Methods and devices for removing entrapped bubbles or air in photovoltaic solar cells during a manufacturing process including an encapsulation process include, for example, wiggling the photovoltaic solar cells or pushing out air bubbles by applying vibrations and/or light pressures. Optional additional steps include liquid wetting or dispensing to or around the photovoltaic solar cell matrix for air releasing before the placement of the matrix into a liquid for encapsulation.

13 Claims, 4 Drawing Sheets

PV MODULE CELL MATRIX PLACEMENT STATION AND METHODS FOR REMOVING AIR OR BUBBLES DURING THE MANUFACTURING PROCESS

CROSS-REFERENCE TO RELATED APPLICATION(S)

This application claims priority under 35 U.S.C. §119(e) of the U.S. Provisional Patent Application Ser. No. 61/888,447, filed Oct. 8, 2013 and titled, PV MODULE CELL MATRIX PLACEMENT STATION," which is also hereby incorporated by reference in its entirety for all purposes.

FIELD OF THE INVENTION

The present invention relates to the field of photovoltaic (PV) cells and methods of manufacturing them. More specifically, the present invention relates to air removal during the PV solar cell manufacturing process.

BACKGROUND OF THE INVENTION

During a typical PV cell encapsulation process, air bubbles are formed in gaps between the glass, liquid, and cells. These bubbles result in voids in the finished PV cells, which, among other things, increase the probability of delamination in the PV cells, decrease the structural strength of the cells, and reduce the energy conversion capabilities of the cells. Prior art systems use vacuum devices to remove entrapped air bubbles between the encapsulating liquid film and the substrate. This requires high capital investments in vacuum chambers and other equipment, while also increasing the manufacturing time.

SUMMARY OF THE INVENTION

Methods of and device for picking up and placing PV solar cells are provided. The materials used include a substrate having a single flat plate PV crystalline module, which comprises silicon cells. Generally, the silicone cells include multiple unit (e.g., 4 units) in an array connected by tabbing ribbon.

In some embodiments, the device serves as an entrapped air bubble removing device in an encapsulation process. The process includes wiggling the photovoltaic solar cells or pushing out air bubbles by applying vibrations and/or light pressures. Further, liquid wetting and/or dispensing to or around the photovoltaic solar cell matrix for air releasing before the placement of the matrix into a liquid for encapsulation is also used.

The device forms a machinery platform/group used to place PV solar cells grouped in a matrix into a liquid encapsulating material and used to eliminate entrapped air between the solar cells (cells), chemicals in liquid forms (e.g., encapsulating materials; ethylene-vinyl acetate (EVA)) and glass. In some embodiments, the device can be used in performing liquid dipping/dispensing and used together with vacuum chambers and/or roller lamination machines.

In one aspect, a PV cell module manufacturing method comprises coupling a glass with one or more photovoltaic cells and removing air or air bubbles in an encapsulating process by using a mechanical motion. In other embodiments, the mechanical motion comprises wiggling. In some other embodiments, the mechanical motion comprises vibration. In some embodiments, the mechanical motion comprises an external applied pressure.

In another aspect, an air removal method in an encapsulating process comprising adding encapsulating material at a centroid of an object until air bubbles are pushed away from an encapsulating layer. In some embodiments, the object comprises a glass. In other embodiments, the object comprises a silicon based material. In some other embodiments, the silicon based material comprises a photovoltaic cell. In some embodiments, the object comprises a body in a flat sheet. In other embodiments, the method further comprises using a mechanical motion to remove the air bubbles. In some other embodiments, the mechanical motion comprises wiggling. In some embodiments, the mechanical motion comprises vibrating. In other embodiments, the method further comprises applying a pressure by pressing to remove the air bubbles.

In yet another aspect, an encapsulating process comprises placing a first object on top of a second object and adding a first encapsulating material along sides of the first object, wherein the first encapsulating material flows underneath the first object through a capillary force. In some embodiments, the first object comprises one or more photovoltaic cells. In other embodiments, the first object comprises a silicon based material. In some other embodiments, the second object comprises a glass. In some embodiments, the process further comprises adding a second encapsulating material on top of the first object. In other embodiments, the second encapsulating material covers all exposed areas of the first object.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings, which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
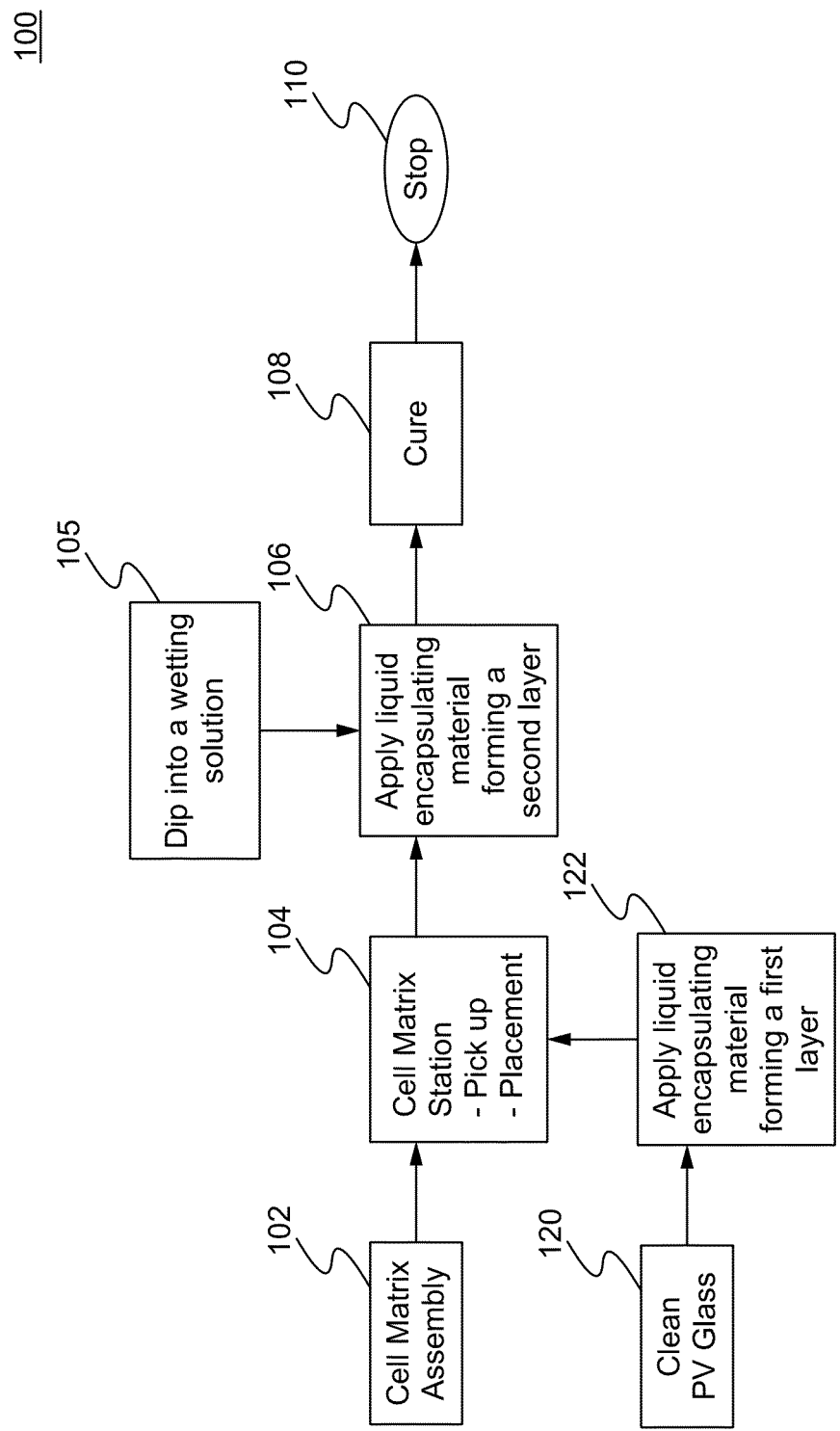
FIG. 1 is a flow chart illustrating a PV cell matrix manufacturing method in accordance with some embodiments of the present invention.

FIG. 1 is a flow chart illustrating a PV cell matrix manufacturing process 100 in accordance with some embodiments of the present invention. At Step 102, a cell matrix is assembled. In some embodiments, a cell matrix includes multiple individual cells, such as 4, 5, 6, or 100, to name only a few examples. The assembly includes soldering one or more cells in a matrix on a fixture using a cell work station (e.g., a modified 3S Meyer Burger Matrix Assembly Station). Solder ribbons and buss bars are used for immobilizing the components.

At Step 104, the assembled cell matrix is transferred on a fixture. The transfer can be done by using a cell matrix pick up machine. In some embodiments, a cell matrix station (e.g., cell matrix assembly station 213, FIG. 2) is used to receive the cell matrix and perform the picking up and placement steps. The cell matrix station can also receive PV glasses processed at Steps 120 and 122, which is further described below.

At Step 120, glasses are cleaned either using a machine or by hand. At Step 122, a $1^{st}$ layer of encapsulating material is applied on the glass. The application of the encapsulating material can be performed by spraying. A person of ordinary skill in the art appreciates that any other methods can be used to apply the encapsulating materials, such as pouring. The glass with the $1^{st}$ encapsulated layer is transported to the cell matrix station at Step 104 for further assembly. At the cell matrix station, the PV cells are placed on the liquid coated/encapsulated glass using a cell matrix pickup machine. The encapsulating materials (the $1^{st}$ and/or $2^{nd}$ layers) can be resin, polymer, polyurethane, or and other polymeric material.

In some embodiments, a light pressure or wiggling of the cell matrix is performed during the PV cell placement, such that air bubbles/or air are removed. In other embodiments at Step 105, a wetting solution or a chemical bath is provided, and the coated glass is dipped into the wetting solution, such that fast wetting is achieved such that air bubbles or air is avoided/removed. In addition, the viscosity of the wetting solution can also be adjusted/controlled, such that the fast wetting to cell/glass can be achieved. In some other embodiments, additional dispensing volume of the encapsulation material is provided in the Step 106, such that air is pushed out in the encapsulation process. Further, a vacuum chamber can also be used to remove air and/or bubbles.

At Step 106, the PV cells placed on the liquid coated glass is transferred to a liquid encapsulation station and a $2^{nd}$ layer of the liquid encapsulation layer is applied. At Step 108, the encapsulation material is cured. In some embodiments, completed PV cells with double encapsulation layers can be transported to a junction box for a frame installation process. At Step 110, the process 100 ends.

Figure 2:
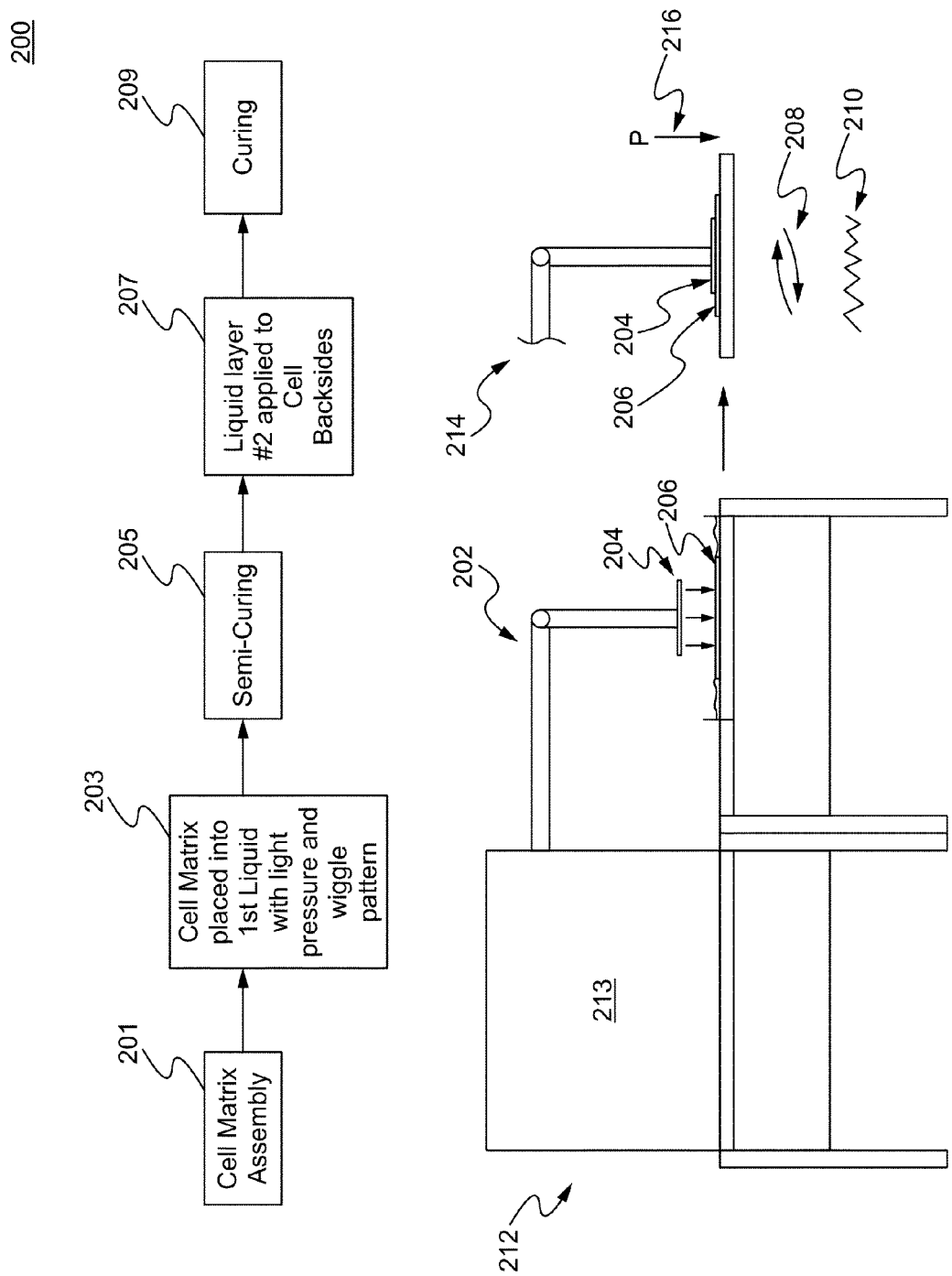
FIG. 2 illustrates another PV cell matrix manufacturing method in accordance with some embodiments of the present invention.

FIG. 2 illustrates a PV cell matrix manufacturing method 200, using a cell matrix assembly station 213, in accordance with some embodiments of the present invention. At Step 201, a cell matrix assembly is performed. At Step 203, a 1st liquid layer of encapsulation is applied on a glass. In the encapsulating process, a PV cell matrix (e.g., 4, 60, or 73 cells interconnected with ribbons) can be picked up and held in a flat position. Next, the PV cell matrix is placed downward with an application of a small pressure (such as 0.5 bar). In some embodiments, a wiggle pattern or vibration is performed to ensure that the cells are pushed down into the liquid encapsulating material and air or bubbles are removed or pushed out. As shown in view 212, a robotic arm 202 holds the PV cell matrix 204. The PV cell matrix 204 is placed downward to the glass 206. In view 214, the PV cell matrix is placed onto the glass 206 with a small pressure 216, a wiggle pattern 208 or a vibrational pattern 210 to remove air or bubbles. At Step 205, curing/semi-curing is performed. The curing can be done by moisture, thermal, or UV (ultraviolet light). At Step 207, a second liquid layer of encapsulation is applied. At Step 209, a curing step is performed.

Figure 3:
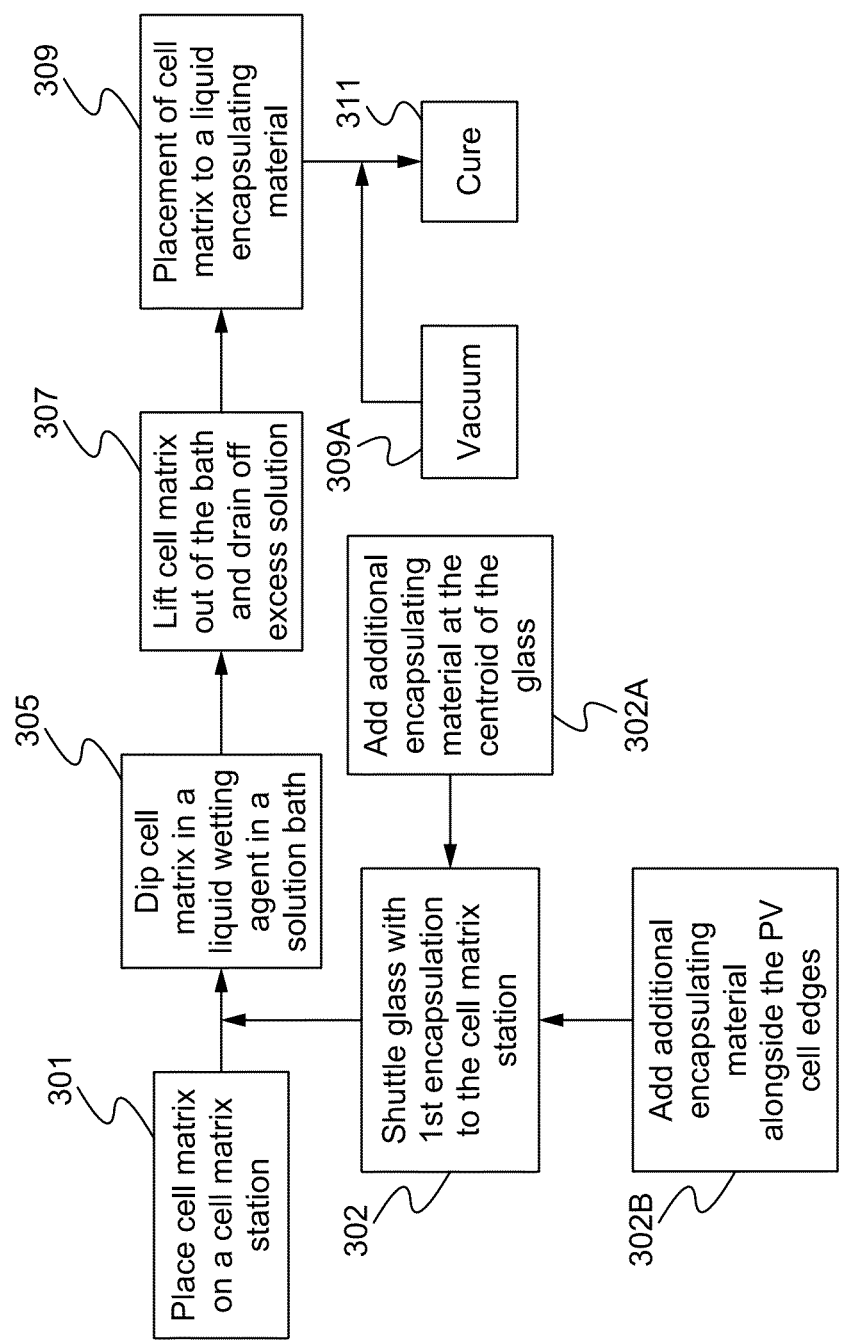
FIG. 3 illustrates another PV cell matrix manufacturing method in accordance with some embodiments of the present invention.

FIG. 3 illustrates a PV cell matrix manufacturing method 300 in accordance with some embodiments of the present invention. At Step 301, a cell matrix is introduced on a fixture system and is lifted up into a cell matrix station. At Step 302, a glass is coated with a $1^{st}$ layer of encapsulating material, which is shuttled to the cell matrix station. At Step 302A, in some embodiments, an additional volume of the liquid encapsulating materials is added in the centroid/approximate centroid on the glass for increasing the volume thickness, which results in increased liquid pressure that pushes away any entrapped air. At Step 302B, in some embodiments, an additional amount of liquid encapsulating material is added alongside the cell matrix features, such as the ribbons and buss bar edges and alongside the PV cell's short and/or long edges, so that the liquid moves underneath the cell matrix features via capillary force and eliminates any air pockets and bubbles.

At Step 305, a cell matrix from the Step 301 is dipped into a liquid wetting agent in a solution bath, which cleans and primes both sides of the PV cells (sun facing side and back side), such that the wettability of the liquid encapsulation material is enhanced. At Step 307, the cell matrix is lifted out of the bath and excess liquid wetting solution removed/drained off.

At Step 309, the cell matrix is placed to be coupled with a glass in a liquid encapsulating material forming a second encapsulated material. In some embodiments, a small pressure and/or a wiggle pattern is applied to remove entrapped air and bubbles from the bottom of the PV cells of the sun facing side. In some embodiments, the liquid encapsulating material is sprayed on the entire backside of the PV cell matrix covering all or substantially all of the exposed areas.

At Step 309A, in some embodiments, an enclosed chamber is added around the conveyer for transporting the PV cell matrix, and a negative pressure or vacuum environment is provided, such that the air entrapped can be removed. A person of ordinary skill in the art appreciates that a vacuum environment can be provided in any of the equipment or steps to remove the air. At Step 311, curing is performed.

Figure 4:
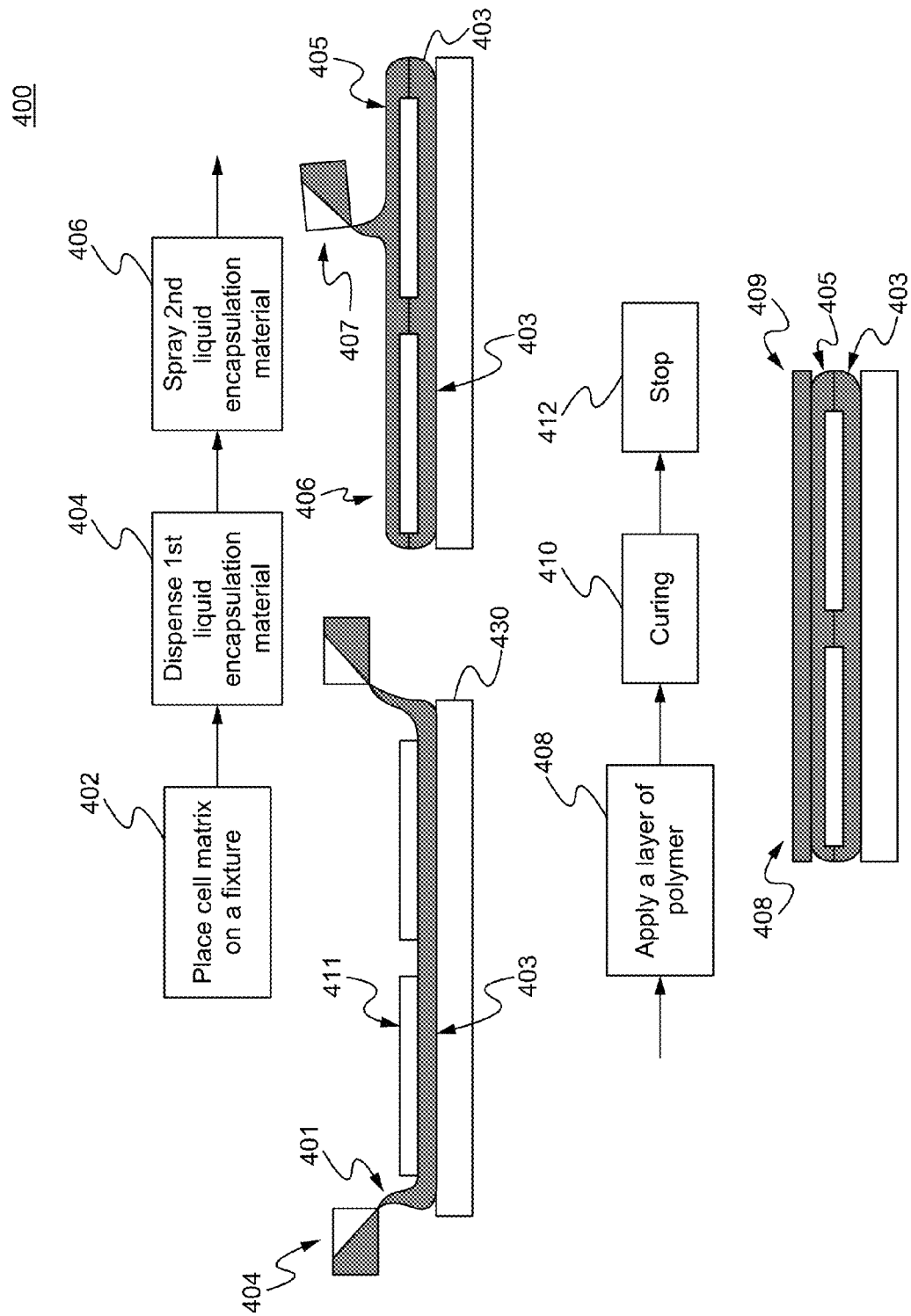
FIG. 4 illustrates another PV cell matrix manufacturing method in accordance with some embodiments of the present invention.

FIG. 4 illustrates a PV cell matrix manufacturing method 400 in accordance with some embodiments of the present invention. At Step 402, a cell matrix is placed on a fixture. The PV cell 411 in a matrix is placed on a backside substrate 430. The sun facing side of the PV cell 411 is facing away from the backside substrate 430. In some embodiments, the backside substrate 430 is fiberglass or glass. At Step 404, a liquid encapsulating material 401 is dispensed alongside the cell 411 features such as ribbons and buss bar edges and alongside the PV cell's short/long edges, so that the liquid goes in underneath the cell matrix features to eliminate air and bubbles. The liquid encapsulating material 401 forms 1$^{st}$ encapsulated layer 403 between the backside substrate 430 and the PV cell 411.

At Step 406, a 2$^{nd}$ liquid encapsulating material 407 is sprayed on the front side of the entire cell to form a 2$^{nd}$ encapsulated layer 405, such that all exposed areas are covered/encapsulated.

After Step 406, at Step 408, a thin layer/sheet of polymer 409 (such as 2 mm) couples with the 2$^{nd}$ encapsulated material 405 at the front side of the PV cell matrix. The thin layer of polymer 409 provides protection against mechanical damages and moisture penetration. In some embodiments, the polymer layer 409 is applied in a sheet form through a set of rollers, which progressively apply the layer to the top surface from one end of the PV cell matrix to the other end of the matrix preventing any entrapped air. At Step 410, a curing step is performed via moisture, thermal, or UV. At the Step 412, the method 400 ends.

In some embodiments, the PV cell matrix comprises a single flat PV crystalline module having silicon cells in any array sizes, such as 4, 5, 6, or 100 cells. The silicon cells can be connected by a tabbing ribbon and buss bar/busbar. In some embodiments, the silicon cell has a thickness around 180 micron.

The method disclosed herein comprises repelling air bubbles entrapped at an interface between a substrate and an encapsulating liquid via vibration, wiggling, and/or applied pressure. The process can be used for encapsulating solar cells (such as thin film/silicon based) and printed circuit boards (PCBs). The air removal encapsulation process reduces the changes of delamination due to voids formed by the entrapped air.

The devices and methods in accordance with embodiments of the invention are used to provide a controlled method to insert/place a PV cell matrix and solidify liquid materials around the PV cell into a rigid substrate without entrapped air.

In operation, a PV cell matrix is positioned using the devices described above and placed either sunny side up or down into a liquid encapsulating material. The device wiggles, vibrates, or applies a light pressure to push any air bubbles out of the gaps between the glass, liquid encapsulating material, and/or the PV cells. After reading this disclosure, those skilled in the art will recognize other mechanical motions that can be used to remove entrapped air in accordance with the principles of the invention. In some embodiments, the cell matrix is dipped into a bath chemical and a liquid is dispensed to or around the cell matrix to aid in wetting and air releasing before the placement of the cell matrix into a liquid encapsulating material. In some embodiments, the introduction of a dispenser to apply additional liquid encapsulating material and a vacuum chamber can also aid in eliminating air pockets under the cell matrix.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiments chosen for illustration without departing from the spirit and scope of the invention as defined by the appended claims.

What is claimed is:

1. A PV cell module manufacturing method comprising:
   a. assembling a photovoltaic cell matrix comprising a plurality of individual photovoltaic cells;
   b. applying a first layer of liquid encapsulating material on a surface of a glass;
   c. placing the photovoltaic cell matrix on the first layer of liquid encapsulating material to form a photovoltaic cell matric assembly, wherein placing the photovoltaic cell matrix on the first layer comprises applying a mechanical motion to remove air or an air bubble;
   d. applying a second layer of liquid encapsulating material on the photovoltaic cell matrix assembly; and
   e. curing the first layer of liquid encapsulating material and the second layer of liquid encapsulating material.

2. The method of claim 1, wherein the mechanical motion comprises wiggling.

3. The method of claim 1, wherein the mechanical motion comprises vibration.

4. The method of claim 1, wherein the mechanical motion comprises an external applied pressure.

5. The method of claim 1, further comprising semi-curing the first layer of liquid encapsulating material after placing the photovoltaic cell matrix on the first layer of liquid encapsulating material and prior to applying the second layer of liquid encapsulating material.

6. The method of claim 1, further comprising applying a wetting solution to the photovoltaic cell matrix assembly prior to applying the second layer of encapsulating material.

7. An air removal method in an encapsulating process comprising:
   a. assembling a photovoltaic cell matrix comprising a plurality of individual photovoltaic cells;
   b. applying a first layer of liquid encapsulating material on a surface of a glass;
   c. adding an additional volume of liquid encapsulating material to the first layer of liquid encapsulating material at a centroid of the surface of the glass;
   d. placing the photovoltaic cell matrix on the additional volume of liquid encapsulating material to form a photovoltaic cell matric assembly, wherein placing the photovoltaic cell matrix on the additional volume comprises applying a mechanical motion to remove air or an air bubble;
   e. applying a second layer of liquid encapsulating material on the photovoltaic cell matrix assembly; and
   f. curing the first layer of liquid encapsulating material and the second layer of liquid encapsulating material.

8. The method of claim 7, wherein the mechanical motion comprises wiggling.

9. The method of claim 7, wherein the mechanical motion comprises vibrating.

10. The method of claim 7, wherein the mechanical motion comprises an external applied pressure.

11. The method of claim 7, further comprising subjecting the photovoltaic cell matrix assembly to a negative pressure environment or a vacuum environment after applying the second layer of liquid encapsulating material and prior to curing.

12. An encapsulating process comprising:
   a. placing one or more photovoltaic cells on top of a glass;
   b. adding a first layer of liquid encapsulating material along sides of the one or more photovoltaic cells, wherein the first layer of liquid encapsulating material flows underneath the one or more photovoltaic cells through a capillary force thereby forming a first encapsulation layer;

c. applying a second layer of liquid encapsulating material on the one or more photovoltaic cells to form a second encapsulating layer, thereby encapsulating the one or more photovoltaic cells;
d. applying a polymer layer over the second layer of liquid encapsulating material; and
e. curing the first layer of liquid encapsulating material and the second layer of liquid encapsulating material.

13. The process of claim 12, wherein the second encapsulating material covers all exposed areas of the photovoltaic cell.

* * * * *